United States Patent [19]

Denzene

[11] 4,114,104
[45] Sep. 12, 1978

[54] CHANNEL SKIP MEMORY SYSTEM FOR RADIO RECEIVER

[75] Inventor: Quentin S. Denzene, Waseca, Minn.
[73] Assignee: E. F. Johnson Company, Waseca, Minn.
[21] Appl. No.: 741,868
[22] Filed: Nov. 15, 1976
[51] Int. Cl.$^2$ .............................................. H04B 1/32
[52] U.S. Cl. ..................................... 325/470; 325/465
[58] Field of Search ............... 325/335, 453, 464, 465, 325/468, 469, 470

[56] References Cited

U.S. PATENT DOCUMENTS

| | | | |
|---|---|---|---|
| 3,665,318 | 5/1972 | Hoffman et al. | 325/470 |
| 3,714,585 | 1/1973 | Koch | 325/468 |
| 3,821,651 | 6/1974 | Fathauer et al. | 325/470 |
| 3,961,267 | 6/1976 | Weissmueller et al. | 325/470 |
| 3,962,644 | 6/1976 | Baker | 325/470 |
| 3,996,522 | 12/1976 | Koch | 325/471 |
| 3,999,131 | 12/1976 | Fukuda | 325/453 |

Primary Examiner—Robert L. Griffin
Assistant Examiner—Marc E. Bookbinder
Attorney, Agent, or Firm—Warren A. Sturm; Hugh D. Jaeger

[57] ABSTRACT

A channel skip memory system for radio receiver having a single channel skipping switch to inhibit the radio receiver from receiving any of selected channels of a plurality of channels of predetermined frequencies while scanning repetitively those channels selected to be received. The channel skipping switch is utilized to skip, inhibit, bypass, look around, etc., any channel of a plurality of channels a listener does not wish to receive when the channel skip memory system connected between the squelch control and the oscillator of the radio receiver has stopped on a channel while scanning in the scan mode or has been stepped to a particular channel by the channel stepping switch in the manual mode by actuating the switch. If the channel skipping switch is actuated a second time when utilizing resettable memory elements on an inhibited channel in the manual mode, the channel is enabled. The channel stepping switch is not functional during the scanning mode. A received channel may be skipped in the scanning mode on the next scanning cycle by actuating the channel skipping switch while that channel is receiving a signal. In the manual mode of operation, each channel is skipped by actuating the channel skipping switch setting a memory for each channel to be skipped. When going from the manual mode to scan mode, the memory having been set determines those channels to be received and those channels to be skipped.

29 Claims, 2 Drawing Figures

CHANNEL SKIP MEMORY SYSTEM FOR RADIO RECEIVER

BACKGROUND OF THE INVENTION

1. Field of the Invention

The present invention relates generally to a radio receiver having a squelch circuit, and more particularly pertains to a new and improved circuit for a channel skip memory system for a radio receiver wherein any predetermined frequencies also known as channels having a plurality of channels can be skipped, inhibited, bypassed, looked around, etc., by inhibiting any predetermined channels of a plurality of channels in a first manual or automatic scanning cycle which are subsequently skipped in second and subsequent scanning cycles.

2. Description of the Prior Art

In the field of scanning radio receivers, it has been a general practice to employ a plurality of switches for an equal plurality of channels to lock out, disable, etc., any channels of predetermined frequencies such as a police frequency, fire frequency, sheriff frequency, highway patrol frequency, etc.

The most common type of lockout, disable, etc., switches employed are slide or pushbutton switches which are slid, or pushed in or out to an on position to lockout, disable, etc., any predetermined channels. A separate slide or pushbutton switch is employed for each separate channel to lockout each channel. These types of switches or any type of a plurality of switches in general are time consuming to utilize in addition to presenting certain maintenance problems to keep the switches in an operational condition.

A typical scanning radio receiver using a plurality of lockout switches, one switch per channel, is described in a patent issued to Boone et al., U.S. Pat. No. 3,883,808, issued on May 13, 1975.

This invention eliminates the use of a separate switch for each of the plurality of channels by providing a single channel skipping, inhibiting bypass, look around, channel choice, etc., switch for all of the channels used in conjunction with a memory for each channel which stores status information as to whether the channel is electronically turned "on" or "off".

SUMMARY OF THE INVENTION

The present invention obviates the foregoing disadvantages of the prior art by providing a single channel skipping switch for a plurality of channels having crystals of predetermined frequencies to be scanned in a radio receiver having a squelch control such as in a frequency modulated receiver. The term skipping also encompasses the terms bypass, inhibiting, look around, choice of channel, etc., and is not to be construed as limiting in its own sense or in the sense of these other terms.

According to one embodiment of this invention, there is provided a channel skip memory system for scanning a plurality of channels having crystals of predetermined frequencies in a radio receiver and having a single channel skipping switch to select the receiving of any channel of a plurality group of channels of predetermined frequencies when used in conjunction with a channel stepping switch to step each channel in numerical sequence, an oscillator clock, a counter, a manual-scan switch to utilize either the manual or the scan mode of operation, logic gates, bistable multivibrators used as a memory for each channel of choice to be skipped, diodes, and crystals, for each of a plurality of channels to oscillate at predetermined frequencies. Further, light emitting diodes are provided for each individual channel as a visual indication of each respective channel being received or scanned.

A significant aspect and feature of this invention is that only a single channel skipping switch is required to inhibit, skip, bypass, look around, choice of a channel, program, etc., any of the plurality of channels in contrast to the prior art which uses one lockout, disable, etc., switch for each of the individual channels. The use of one switch provides better reliability and lower costs by eliminating each switch per channel.

An additional feature of the invention is the utilization of bistable multivibrators, one for each channel, as a solid state memory with gating functions for each channel to provide the channel skipping capability for skipping any of the channels eliminating the need for individual lockout, disable, etc., switches. The solid state memory consists of a bistable multivibrator comprising two NAND gates and logic gates comprising two additional NAND gates, a total of four NAND gates for each channel memory. The memory is set in the manual mode and is erased in switching from the scan to the manual mode. The memory also holds status information regarding the on-off status for each particular channel.

Having briefly described the embodiment of the present invention, it is a principal object thereof to provide a channel skip memory system utilizing a single channel skipping switch to select channels of respective predetermined frequencies in radio receiver where the channels are scanned repetitively and cyclically in regular sequence. The circuitry lends itself to a single integrated circuit or more depending upon the number of channels.

An object of the present invention is to provide a radio receiver having a squelch control with a channel skip memory system to scan a plurality of channels which eliminates the need for individual channel disable, lockout, etc., switch for each individual channel. This is advantageous from an economic standpoint.

Another object is to provide in the channel skip memory system having a manual-scan switch and a channel stepping switch for use with a radio receiver to repeatively scan a plurality of channels a single channel stepping switch so an operator can step to and select by his own choice with a channel skipping switch those channels that he desires to receive and those channels that he desires to skip, bypass, inhibit, look around, etc. When the manual-scan switch is in the manual position, the manual-scan switch permits manual stepping of each channel in ascending numerical order for the plurality of channels of predetermined frequencies such as a police frequency, fire frequency, highway patrol frequency, etc. If the operator wishes to skip a channel through his own choice, then the channel skip switch is actuated to skip that channel and inhibit the channel skip memory system in the radio receiver from again receiving that channel during scanning on the next scan cycle of all the channels. When utilizing resettable memory elements, the channel skipping switch is actuated a second time in the manual mode after that channel is inhibited, then the channel is uninhibited and is not skipped, bypassed, programmed out, or looked around during that next scanning cycle. When the manual-scan switch is in the scan position, the channel skipping system scans all the channels in numerical order and skips those inhibited channels. When a signal is received from the squelch control of the radio receiver to dwell on a received channel in the scan position, that received channel can thereupon be skipped by pressing the channel skipping switch and that channel is skipped as the squelch control no longer receives a signal as the crystal of that channel no longer oscillates.

A further object of the invention is the provision of a solid state memory used along with logic gating functions for each individual channel to electronically memorize whether the channel when scanned is to be received or skipped and to electronically act as an electronic channel on-off switch in lieu of a manual on-off switch respectively. The memory is a bistable multivibrator and is set by actuating the channel skipping switch only while the scanning radio receiver is receiving a channel in the scan mode or is stepped to and receiving a channel in the manual mode. Also, the memory in the manual mode after actuating the channel skipping switch to inhibit a channel can again be pressed a second time to enable the respective inhibited channel if a resetable memory element is utilized. The memory further can be utilized as a status indicator to indicate whether the channel is programmed to receive a channel or is programmed to inhibit a channel.

An additional object is the provision that in the scan mode of operation, the channel stepping switch is disabled so that the memories for the channels can not be changed. In the scan mode, a received channel may be skipped by actuating the channel skipping switch while stopped on and receiving a particular channel, and the scanning will resume with that particular channel being skipped in the subsequent scanning cycle.

A still further object of the invention is to provide visual indication for each of the channels being received whether in the automatic channel scanning mode or in the manual channel stepping mode. Further, visual indication can be provided to indicate whether a channel is enabled or inhibited; that is, to be skipped.

BRIEF DESCRIPTION OF THE DRAWING

Other objects and many of the attendant advantages of this invention will be readily appreciated as the same becomes better understood by reference to the following detailed description when considered in connection with the accompanying drawings, in which like references numerals designate like parts throughout the figures thereof and wherein:

FIG. 1 illustrates a block diagram of the preferred embodiment of the invention, and;

DESCRIPTION OF THE PREFERRED EMBODIMENTS

FIG. 1 illustrates a block diagram of a radio receiver 10 showing a channel skip memory system 12 for skipping any preselected channels and is electrically connected between a squelch control circuit 14 and an oscillator 16 in the radio receiver 10. The radio receiver 10 may also use an antenna, a radio frequency amplifier, a mixer, an intermediate frequency amplifier, an audio amplifier, and a speaker which are all respectively labeled on the block diagram of the figure.

Figure 2:
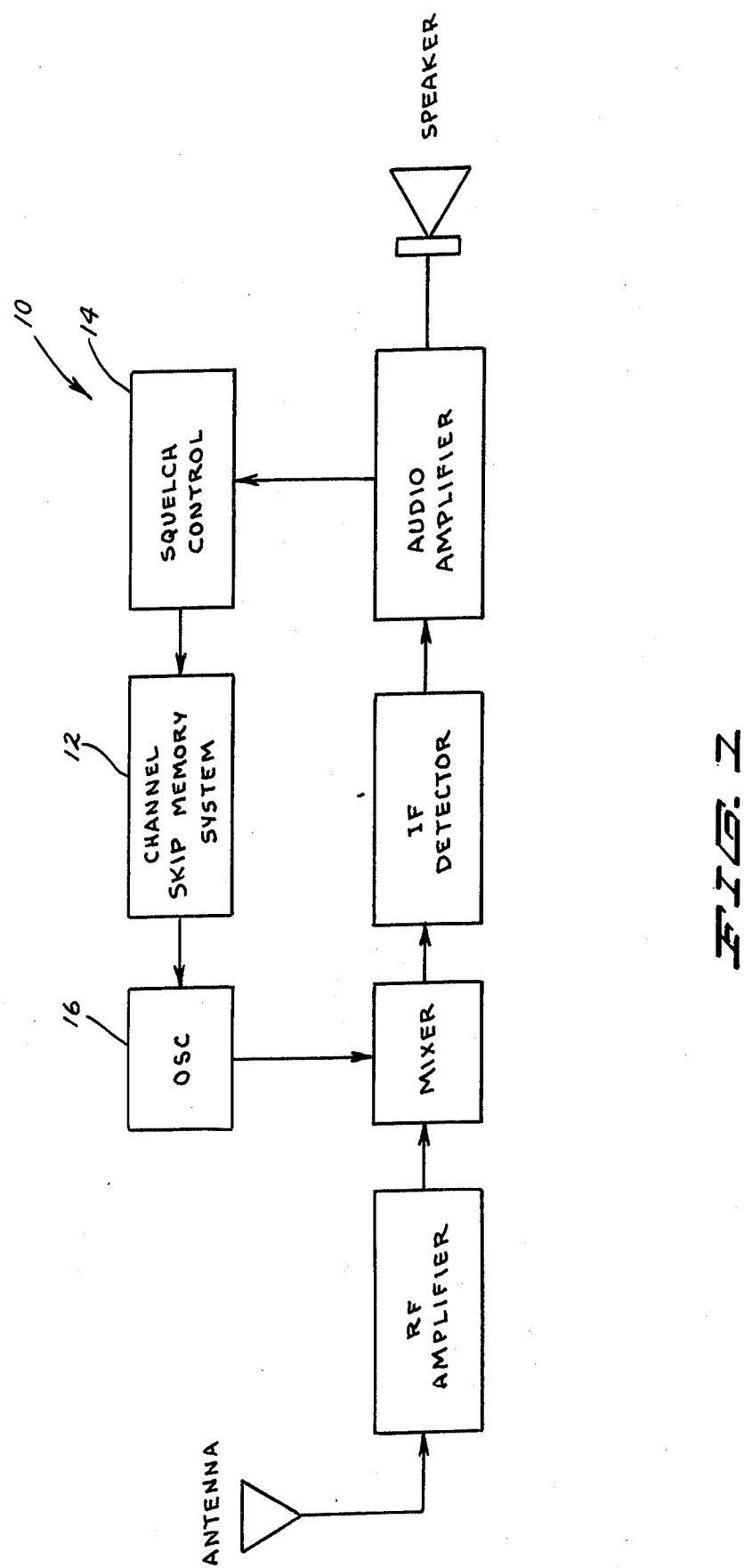
FIG. 2 illustrates a circuit schematic of the invention.
Figure 2:
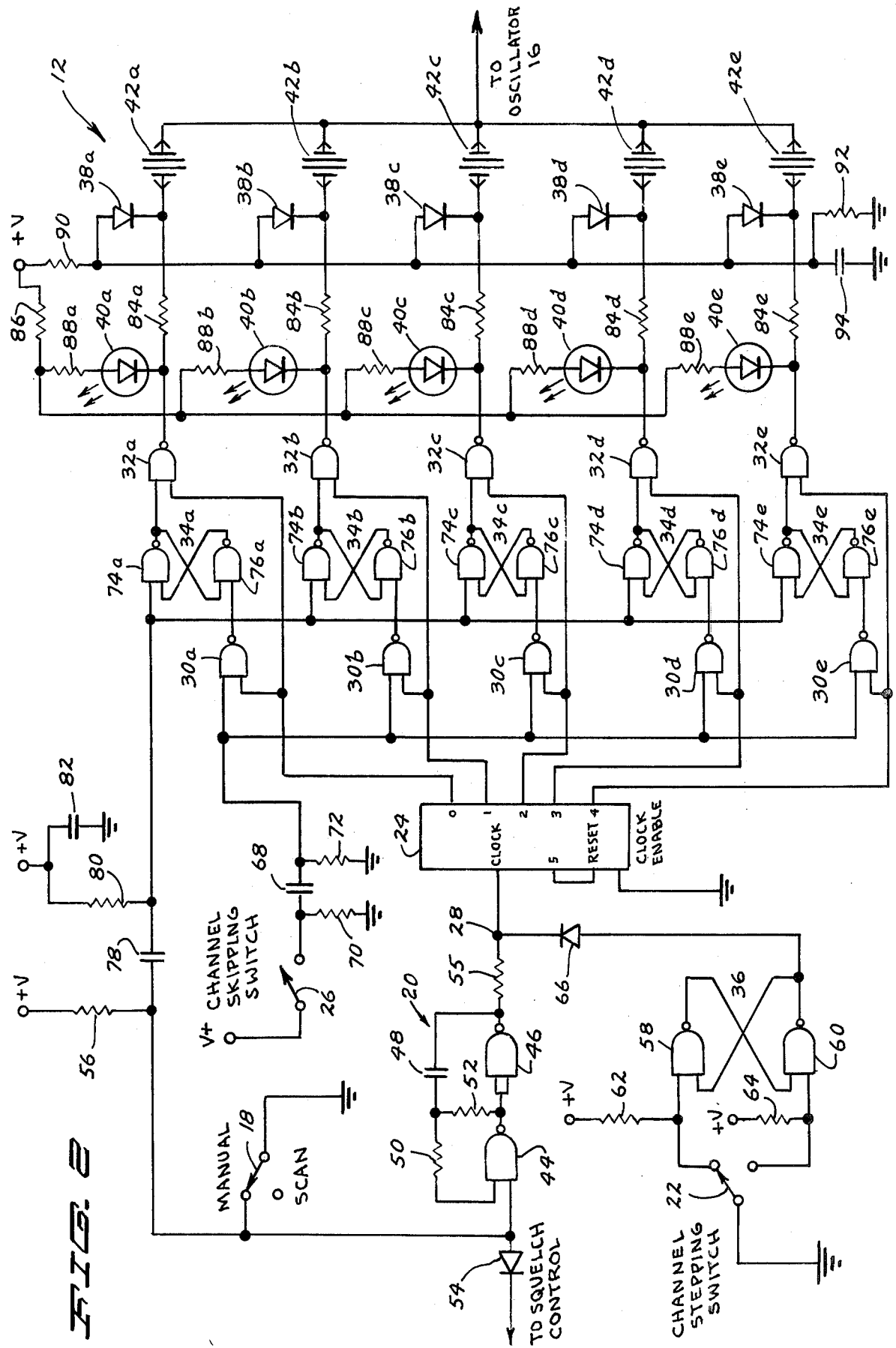

FIG. 2 illustrates a circuit diagram of channel skip memory system 12 for skipping any preselected channels. The circuitry of the channel skip memory system 12 of this invention consists of a manual-scan switch 18, a free-running gate oscillator clock 20, a channel stepping switch 22, a counter 24, a channel skipping switch 26, wired OR logic gate 28, logic gates 30a–30e and 32a–32e, bistable multivibrators 34a–34e and 36, diodes 38a–38e, light emitting diodes 40a–40e, and crystals 42a–42e to oscillate at any predetermined frequencies such as a police frequency for channel 1, a fire frequency for channel 2, a highway patrol frequency for channel 3, etc., up to channel 5. The electrical connection of these and other related components is now described in detail with reference being made to the figure.

In FIG. 2, free running gate oscillator clock 20 is an astable multivibrator where the output of a NAND gate 44 is connected to both inputs of a NAND gate 46. A capacitor 48 and a resistor 50 connect in series from the output of the NAND gate 46 to one of the inputs of NAND gate 44. A resistor 52 connects from the junction of capacitor 48 and resistor 50 to the junction of the output of NAND gate 44 and the inputs of NAND gate 46. The frequency of the oscillator clock 20 is determined by the values of the capacitor 48 and the resistors 50 and 52. A diode 54 having its anode connected to the other input of NAND gate 44 connects the channel skip memory system 12 to the squelch control of the radio receiver 10. Single pole single throw manual-scan switch 18 having a manual position and a scan position connects from the other input of NAND gate 44 and the anode of diode 54 to ground. Resistor 56 connects from a voltage source V to the manual position of manual-scan switch 18. Voltage source V may be any suitable source of voltage compatible with the type of circuitry utilized. Resistor 56 provides bias for the diode 54 and a set input for NAND gate 44 of the oscillator clock 20 in conjunction with the scan position of the manual-scan switch 18. A coupling resistor 55 connects the output of the NAND gate 42 to the clock input of a counter 24.

Two cross coupled NAND gates 58 and 60 form a bistable multivibrator 36. The output of NAND gate 58 is connected to one of the inputs of NAND gate 60 and the output of NAND gate 60 is connected to one of the inputs of NAND gate 58. A momentary single pole double throw channel stepping switch 22 having a normally closed contact connects between the other input of NAND gate 58 and ground. The normally open contact of channel stepping switch 22 connects to the other input of NAND gate 60. Resistors 62 and 64 connect from the voltage source V to the normally closed and normally open contacts of channel stepping switch 22 respectively to provide the set input for the NAND gates 58 and 60. A diode 66 having its anode connected to the output of NAND gate 60 connects the output of NAND gate 60 to the clock input of the counter 24. A "DOT OR " or "WIRED OR" logic gate 28 is formed by the wired junction of coupling resistor 55 and the cathode of diode 66 at the clock input to the counter 24. The NAND gates 44, 46, 58, and 60 may be an integrated circuit normally containing four logic NAND gates; two of which are used for the oscillator clock 20 and the remaining two for the bistable multivibrator 36.

A counter 24 having decoded outputs "0", "1", "2", "3", and "4" comprise five designated channels to cyclically control the scanning for five predetermined frequencies corresponding to five channels. Output "5" is tied to the counter reset input and the clock enable is connected to ground. The number of decoded outputs comprising an equal number of channels for predetermined frequencies is not to be construed as limiting in any sense as five channels is only used for purposes of illustration and example. The number of channels is only limited by the number of decoded outputs of the counter 24 which may have any number of channels such as 8, 10, etc., or more than one counter may be wired together for a larger number of channels. The counter 24 is clocked by the circuitry of free running gate oscillator 20.

The circuitry associated for each individual separate channel corresponding to a predetermined frequency is identical to that of the other channels, so for purposes of illustration and description, the circuitry for each channel indicated by alphabetical designation $a-e$ of its respective decoded output of five channels is hence described.

The output corresponding to each individual channel of the counter 24 connects to an input of NAND gates 30$a$-30$e$, one for each of the five channels. The other input of NAND gates 30$a$-30$e$ connects to a coupling capacitor 68 in series with a single pole single throw momentary normally open channel skipping switch 26 which connects to the voltage source V. Resistors 70 and 72 connect from both sides of the capacitor 68 to ground.

Two cross coupled NAND gates 74$a$-74$e$ and 76$a$-76$e$, one for each channel, form a bistable multivibrators 34$a$-34$e$, one for each channel. The output of NAND gates 74$a$-74$e$ connects to one of the inputs of NAND gates 76$a$-76$e$ and the output of NAND gates 76$a$-76$e$ connects to one of the inputs of NAND gates 74$a$-74$e$. The output of NAND gates 30$a$-30$e$ connects to the other input of NAND gates 76$a$-76$e$. A coupling capacitor 78 connects between the other input of NAND gates 74$a$-74$e$ and the manual position of manual-scan switch 18. Resistor 80 connects from the voltage source V to the other input of NAND gates 74$a$-74$e$ to provide a set input for bistable multivibrators 34$a$-34$e$. Bypass capacitor 82 connects from the voltage source side of resistor 80 to ground to supress transients. One input of NAND gates 32$a$-32$e$, one for each channel, connects to the output of NAND gates 74$a$-74$e$ of the bistable multivibrators 34$a$-34$e$. The other input of NAND gate 32$a$-32$e$ connects to the output for each channel of the counter 24 and the input of NAND gates 30$a$-30$e$, respectively. The NAND gates 30$a$-30$e$, 32$a$-32$e$, 74$a$-74$e$, and 76$a$-76$e$ may be an integrated circuit normally containing four logic NAND gates, one for each channel; two logic NAND gates 30 and 32 and the remaining two for the bistable multivibrator 34 consisting of NAND gates 74 and 76.

A J-K flip-flop or any other type of solid state resettable memory element may be substituted for NAND gates 30$a$-30$e$, 74$a$-74$e$, and 76$a$-76$e$, one J-K flip-flop per channel. The J and K inputs are tied together to form a toggle flip-flop and connect to each respective channel output of the counter 24. The clock input connects to the output of channel skipping switch 26 through capacitor 68. The set input connects to one side of capacitor 78. Q output of the J-K flip-flops connect to the input of NAND gates 32$a$-32$e$.

Resistors 84$a$-84$e$, one for each channel, connect the output of NAND logic gates 32$a$-32$e$, one for each channel, to the cathode of diodes 38$a$-38$e$, one for each channel, and one side of crystals 42$a$-42$e$, wherein there is an individual crystal of a predetermined frequency for each separate individual channel of the five channels in this particular example. The other side of crystals 42$a$-42$e$ connects to oscillator 16 of radio receiver 10 as illustrated in FIG. 1. A resistor 86 connects from the voltage source V to a series connection of resistors 88$a$-88$e$, one for each channel, and the anode of light emitting diodes (LED) 40$a$-40$e$, one for each channel, whose cathode in turn connects to the junction of the output of NAND gates 32$a$-32$e$ and resistors 84$a$-84$e$, respectively. Resistor 90 connects in series with diodes 38$a$-38$e$ whose cathode connects to the junction of resistors 84$a$-84$e$ and one side of crystals 42$a$-42$e$ respectively. Resistor 90 couples positive supply voltage from voltage source V to diodes 38$a$-38$e$, one for each channel. Resistor 92 connects from the junction of resistor 90 and diodes 38$a$-38$e$ to ground to reverse bias the diodes 38$a$-38$e$. Capacitor 94 parallels across resistor 92 to provide an alternating current path from the anode of diodes 38$a$-38$e$ to ground.

PREFERRED MODE OF EMBODIMENT

Channel skip memory system 12 scans a plurality of predetermined frequencies designated as respective channels, in numerical order, five in this instance for way of example and illustration only. The number of channels is not to be construed as limiting in any sense as the number of channels may be more or less in number, and is only limited by the number of counters and outputs of such. Whenever a radio frequency (rf) signal is received by the radio receiver 10, the output of squelch control 14 forward biases diode 54 of channel skip memory system 12 thereby stopping the oscillator clock 20 in turn stopping the counter 24 for that particular channel being received.

In the scanning mode, the radio receiver 10 dwells or receives on a particular channel when the rf signal is present corresponding to the frequency of the crystal for the particular channel being received. When the rf signal is no longer received for a predetermined time as determined by the electrical characteristics of the squelch control circuitry 14, diode 54 is reversed biased and the oscillator clock 20 again starts running in turn driving the counter 24 for scanning each individual channel in numerical sequence by the channel skipping system in the radio receiver 10.

During the scanning mode when the manual-scan switch 18 is in the scan position, each channel is momentarily switched 'ON' and 'OFF' in numerical sequence as determined by the time constant of values of capacitor 48 and resistors 50 and 52 which control the frequency of the oscillator clock 20. The pulses from the oscillator clock 20 are continuously applied to the clock input of counter 24 to sequentially energize each of the decoded outputs "0", "1", "2", "3", and "4" of the counter 24 corresponding to the five channels. Assuming for the moment that none of the channels are inhibited and are therefore skipped, bypassed, looked around, etc., the five inputs from the counter 24 are respectively applied to the five NAND gates 30$a$-30$e$ and the five NAND gates 32$a$-32$e$. The five bistable multivibrators 34$a$-34$e$ are in a state in which a high output appears at the other input of the NAND gates 32$a$-32$e$ so as to provide a low output to forward bias and turn on the diodes 38$a$-38$e$ through the resistors 84$a$-84$e$, respectively, whenever each of the five respective channel outputs of counter 24 are energized. A low output of NAND gates 32$a$-32$e$ biases "on" diodes 38$a$-38$e$ further turning "ON" each individual channel having a crystal of a predetermined frequency such as police, fire, highway patrol, etc., of the oscillator 16 of the radio receiver 10. The NAND gates 32$a$-32$e$ and the diodes 38$a$-38$e$ are in effect electrical channel "ON"-"OFF" switches for the crystals 42a–42e corresponding to the individual channels. In this condition, the diodes 38a–38e are forward biased through resistors 84a–84e and NAND logic gates 32a–32e providing an alternating current path for crystals 42a–42f through diodes 38a–38e and capacitor 94 to ground. Also, the low output of NAND gates 32a–32e turns "ON" light emitting diode 40a–40e biased through resistors 88a–88e and NAND gates 32a–32e, respectively, for each scanned channel. When any channel is not being received or scanned; that is, the output of NAND gates 32a–32e is high for the respective unreceived or unscanned channels, resistor 92 reverse biases the diodes 38a–38e for the respective unreceived or unscanned channels to prevent random oscillations of crystals 42a–42e for the respective channels. The scanning operation of the channel skip memory system 12 continues in numerical sequence for each channel as the counting of the counter 24 proceeds from output "0" to output "4" corresponding to the five channels in the example whereupon the counter resets itself back to zero to cyclically repeat the scanning process in seriatim.

In the scan mode of operation when manual-scan switch 18 is set to the scan position, the oscillator clock 20 is always oscillating assuming that a signal from squelch control circuit 14 is not present to forward bias the diode 54 thereby stopping the oscillator clock 20. As described, each of the five channels is momentarily turned "ON" and "OFF" in seriatim. When a signal is received by squelch control circuitry 14 from the radio receiver 10, it forward biases the diode 54 and the oscillator clock 20 stops the counter 24 on that particular channel of a predetermined frequency. The channel may then be skipped, inhibited, looked around, bypassed, etc., on its next scanning cycle by actuating the momentary normally open single pole single throw channel skipping switch 26. The channel skipping switch 26 generates a short pulse and programs by resetting one of the multivibrators 34a–34e, the particular one for the respective received channel, through NAND gates 30a–30e, the particular one for the respective received channel. The channel skipping switch 26 applies a signal to the other input of the particular NAND gates 30a–30e for the respective channel being received along with a signal at the input of the particular NAND gates 30a–30e for the respective channel to the decoded output of the counter 24. The respective NAND gates 30a–30e provide a low input to the other input of NAND gates 76a–76e of bistable multivibrators 34a–34e for the respective channel being received causing the bistable multivibrators 34a–34e to reverse its state, so that there will be no output from the output terminal of NAND gates 74a–74e of the bistable multivibrators 34a–34e thereby resulting in a low output applied to the input of NAND gates 32a–32e, and the output from the counter 24 is therefore not passed to the respective diodes 38a–38e for crystals 42a–42e for that channel to be skipped. Once channel skipping switch 26 is actuated, the crystals 42a–42e for the channel ceases to oscillate thereby reverse biasing diode 54 causing oscillator clock 20 to begin running again causing the counter 24 onto the next channel.

The NAND gates 32a–32e are in effect electrical solid state channel on-off switches for each respective channel. Any other type of suitable current controlling device may be utilized. The output of NAND gates 32a–32e is low for an "ON" channel and high for an "OFF" skipped, inhibited, etc., channel. Hence, that particular crystal 42a–42e does not oscillate for the skipped channel. The bistable multivibrators 34a–34e therefore act as a memory for each individual channel respectively resulting in the channel skipping system in the radio receiver 10 to skip any inhibited channels which are received during the scanning mode. This skipping action and memory of channel skipping switch 26 inhibits the received channel by turning the respective channel "OFF" through the respective NAND gates 32a–32e thereby reverse biasing diode 54 which starts the oscillator clock 20 to begin the counter 24 to resume scanning of the remaining channels.

In the manual mode of operation when the manual-scan switch 18 is set to the manual position, the oscillator clock 20 is stopped and the channel skip memory system 12 of the radio receiver 10 is therefore not automatically scanning the plurality of channels. The bistable multivibrators 34a–34e are automatically reset to a high output when manual-scan switch 18 is switched from the scan position to the manual position through the discharge of capacitor 78. All the channels may in turn be stepped in sequence by manually stepping or in effect cyclically scanning the counter 24 via bistable multivibrator 36 by depressing momentary single pole double throw stepping switch 22 once for each channel to be stepped in numerical sequence. Any of the channels to which the counter 24 has been stepped may be skipped, inhibited, etc., by depressing the channel skipping switch 26. Light emitting diodes 40a–40e light for that particular channel stepped to or being received to provide a visual indication for that respective channel.

In the manual mode of operation, the operator of the channel skipping system of the radio receiver 10 may inhibit one or more of any of the channels in the numerical stepping sequence one at a time. The channel skipping switch 26 is utilized and operates exactly as previously explained for the scan mode of operation. To skip a channel in the manual mode, channel skipping switch 26 is actuated resulting in a signal applied to the input of NAND gates 30a–30e concurrently with a signal received from the respective output of the counter 24 to the other input of NAND gates 30a–30e to provide a signal to the other input of NAND gates 76a–76e on bistable multivibrators 34a–34e for that particular stepped to channel to reverse its state so that there will be no output from the output terminal of NAND gates 74a–74e of the bistable multivibrators 34a–34e. Therefore, any signal applied to the input of NAND gates 32a–32e will not be passed to forward bias diodes 38a–38e thereby not setting crystal 42a–42e into oscillation for that respective frequency of the channel being received.

J-K flip-flops or any other type of solid state resettable memory elements may be substituted for NAND gates 30a–30e, 74a–74e and 76a–76e, one J-K flip-flop per channel as previously described. In using a single line resettable memory, the channel skipping switch 26 may be actuated once again for an inhibited channel to enable that channel so that the channel would not be skipped, etc. The channel skip switch 26 toggles the J-K flip-flop when the J and K inputs are both high and when the channel is on by the counter being at its respective channel output.

The bistable multivibrators 34a–34e provide solid state programmable memory so when the manual-scan switch 18 is turned from a manual position to a scan position, the inhibited channels are skipped, bypassed, looked around, etc., by the solid state memory of the bistable multivibrators 34a–34e and causing solid state channel on-off NAND gates 32a–32e not to set the crystals 42a–42e into operation for those channels designated to be skipped.

Various modifications are contemplated and may obviously be resorted to by those skilled in the art without departing from the spirit and scope of the invention, as hereinafter defined by the appended claims, as only a preferred embodiment thereof has been disclosed. Light emitting diodes, one for each channel, may connect to each bistable multivibrators 34a–34e or J-K flip-flops, whichever is utilized as the programmable electronic solid state memory, to indicate the status of each individual channel as to whether the channel is turned on to receive a rf signal or programmed to be turned off so as to skip, etc., the respective channel. The status light for each channel would indicate whether the channel is turned on being enabled or turned off being skipped.

Having thus described the invention, there is claimed as new and desired to be secured by Letters Patent:

1. Channel skip memory system for use in a radio receiver and connected in said receiver between a squelch control and an oscillator comprising
   (a) manual-scan means having a manual mode of operation and a scan mode of operation;
   (b) clock means connected to said manual-scan means;
   (c) means connecting said clock means to said squelch control of said radio receiver;
   (d) counter means connected to said clock means and having a plurality of outputs, each of said outputs corresponding to an individual channel of a predetermined frequency;
   (e) plurality of first logic means having two inputs, one of said inputs of each of said first logic means connected to each of said plurality of outputs of said counter;
   (f) channel skipping means connected to the other of said inputs of each of said first logic means;
   (g) plurality of memory means having two inputs, one of said inputs of each of said memory means connected to each output of said plurality of first logic means;
   (h) reset means connected between said manual-scan means and the other of said inputs of each of said memory means;
   (i) plurality of second logic means having two inputs, one of said inputs of each of said second logic means connected to the output of said memory means and the other of said inputs of each of said plurality of second logic means connected to each respective output of said plurality of outputs of said counter;
   (j) plurality of diodes connected to each of the outputs of said plurality of second logic means, and;
   (k) plurality of crystals of predetermined frequencies, one crystal per channel connected between each of said plurality of diodes and said oscillator whereby said clock means drives said counter to cyclically scan and receive seriatim each of said channels in regular sequence and a voltage differential received by said connecting means stops said clock means to receive the radio frequency signal on a particular channel scanned and whereby actuating said channel skipping means while receiving a signal on one of said plurality of channels generates a short pulse to reset said memory means for the particular channel being received so that the channel is skipped on subsequent scanning cycles.

2. Channel skip memory system of claim 1 wherein said manual-scan means comprises a single pole double throw manual-scan switch whereby said switch has a manual mode of operation position and a scan mode of operation position.

3. Channel skip memory system of claim 2 further comprising means to reset said memory means whereby said manual-scan switch when switched from a scan position to a manual position resets all of said plurality of memory means simultaneously.

4. Channel skip memory system of claim 1 wherein said clock means comprises an astable multivibrator.

5. Channel skip memory system of claim 4 wherein said astable multivibrator comprises two end-coupled NAND logic gates.

6. Channel skip memory system of claim 1 wherein said connecting means comprises a diode having its anode connected to said manual-scan means and said clock means and its cathode connected to said squelch control.

7. Channel skip memory system of claim 1 wherein said counter means comprises a clock input connected to said clock means, the maximum count output of said plurality of outputs connected to a reset input of said counter and a clock enable input connected to ground whereby said counter when counting in numerical sequence automatically resets itself to cyclically scan said channels seriatim.

8. Channel skip memory system of claim 1 wherein said plurality of first logic means comprises an equal plurality of NAND logic gates.

9. Channel skip memory system of claim 1 wherein said plurality of memory means comprises an equal plurality of bistable multivibrators.

10. Channel skip memory system of claim 9 wherein each of said bistable multivibrators comprises two cross-coupled NAND logic gates for each of said plurality of multivibrators.

11. Channel skip memory system of claim 1 wherein said plurality of second logic means comprises an equal plurality of NAND logic gates.

12. Channel skip memory system of claim 1 further comprising a plurality of visual indicating means, each of said plurality of visual indicating means connecting to each of said plurality of second logic means to provide visual indication when each channel is scanned, manually or automatically.

13. Channel skip memory system of claim 12 wherein each of said visual indicating means comprises a light emitting diode.

14. Channel skip memory system of claim 1 wherein the combination of said plurality of first logic means and said plurality of memory means comprises an equal plurality of resettable memory elements.

15. Channel skip memory system of claim 14 wherein each of said resettable memory elements comprises a J-K flip-flop whereby said J-K flip-flop has inputs connected to said counter output, a clock input of said J-K flip-flop connects to said channel skipping means, a set input of said J-K flip-flop connects to said manual-scan means, and an output of said J-K flip-flop connects to said input of said second logic means.

16. Channel skip memory system of claim 14 wherein said reset means comprises a capacitor whereby said manual-scan means being switched from the scan position to the manual position thereby resetting said equal plurality of resets memory elements.

17. Channel skip memory system of claim 14 wherein said reset means comprises a capacitor whereby actuating said channel skipping means in the manual-mode once again for an inhibited channel subsequently enables that channel so that the channel will not be skipped.

18. Channel skip memory system of claim 14 wherein said reset means comprises a capacitor whereby actuating said channel skipping means can upon actuation inhibit channels received in the scan mode of operation, inhibit channels sequentially stepped to by said counter means in the manual-mode of operation and subsequently skipped when sequentially scanned in the scan mode of operation.

19. Channel skip memory system of claim 1 further comprises a plurality of status indication means connected to each of said plurality of memory means.

20. Channel skip memory system of claim 19 wherein said status indicating means comprises a light emitting diode for each of said plurality of memory means.

21. Channel skip memory system of claim 1 further comprising a plurality of status indication means connected to each of said plurality of memory means whereby said indication means indicates the enable and inhibit status of each channel.

22. Channel skip memory system of claim 1 wherein said channel skipping means comprises a momentary, normally open single pole single throw switch.

23. Channel skip memory system of claim 1 further comprising a channel stepping means and pulse means connected between said channel stepping means and said counter whereby said stepping means actuates said counter through said pulse means each time said stepping means is actuated to step and receive each channel seratimly.

24. Channel skip memory system of claim 23 wherein said channel skipping means comprises a momentary single pole double throw switch.

25. Channel skip memory system of claim 23 wherein said pulse means comprises a bistable multivibrator which acts as a noise suppressor for said channel stepping switch.

26. Channel scanning system of claim 23 wherein said pulse means comprises a cross-coupled NAND gate flip-flop.

27. Channel skip memory system of claim 1 wherein said channel skipping means comprises a short pulse generation means.

28. Channel skip memory system of claim 1 wherein said channel skipping means comprises a switch.

29. Channel skip memory system of claim 1 wherein said reset means comprises a capacitor whereby said manual-scan means being switched from the scan position to the manual position resets said memory means.

* * * * *